US010842044B2

(12) United States Patent
Snyder

(10) Patent No.: US 10,842,044 B2
(45) Date of Patent: Nov. 17, 2020

(54) COOLING SYSTEM IN HYBRID ELECTRIC PROPULSION GAS TURBINE ENGINE

(71) Applicant: Rolls-Royce North American Technologies, Inc., Indianapolis, IN (US)

(72) Inventor: Douglas J. Snyder, Carmel, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 293 days.

(21) Appl. No.: 15/645,490

(22) Filed: Jul. 10, 2017

(65) Prior Publication Data
US 2019/0014687 A1   Jan. 10, 2019

(51) Int. Cl.
| | |
|---|---|
| *H05K 7/20* | (2006.01) |
| *B64D 33/08* | (2006.01) |
| *F02K 3/115* | (2006.01) |
| *F02C 7/16* | (2006.01) |
| *F02C 6/20* | (2006.01) |

(Continued)

(52) U.S. Cl.
CPC ......... *H05K 7/20336* (2013.01); *B64D 27/10* (2013.01); *B64D 27/24* (2013.01); *B64D 33/08* (2013.01); *F02C 6/20* (2013.01); *F02C 7/16* (2013.01); *F02K 3/115* (2013.01); *H05K 7/209* (2013.01); *H05K 7/2039* (2013.01); *H05K 7/20309* (2013.01); *H05K 7/20318* (2013.01); *H05K 7/20936* (2013.01); *B64D 2027/026* (2013.01); *F02C 3/04* (2013.01); *F02K 3/06* (2013.01); *F05D 2220/323* (2013.01); *F05D 2260/207* (2013.01); *F05D 2260/208* (2013.01); *F05D 2260/213* (2013.01)

(58) Field of Classification Search
None
See application file for complete search history.

(56) References Cited

U.S. PATENT DOCUMENTS

| | | | |
|---|---|---|---|
| 3,429,122 | A | 2/1969 | Pravda et al. |
| 6,076,595 | A | 6/2000 | Austin et al. |

(Continued)

OTHER PUBLICATIONS http://norenproducts.com/industries/aerospace/; printed Jul. 11, 2017 (1 page).

(Continued)

*Primary Examiner* — Steven M Sutherland
*Assistant Examiner* — Rodolphe Andre Chabreyrie
(74) *Attorney, Agent, or Firm* — Shumaker & Sieffert, P.A.

(57) ABSTRACT

A cooling system in a hybrid electric propulsion gas turbine engine is provided for cooling electrical components therein. The cooling system includes an electrical component disposed in proximity to an aircraft power generation component in the hybrid electric propulsion gas turbine engine such that the electrical component is thermally heated by the aircraft power generation component. A loop heat pipe structure is in thermal communication with the electrical component to transfer heat away from the electrical component. Wherein the loop heat pipe includes an evaporator portion, a condenser portion, a first pipe to supply a biphasic working fluid in a liquid state to the evaporator portion, and a second pipe to return the biphasic working fluid in a gaseous state to the condenser portion.

17 Claims, 6 Drawing Sheets

(51) Int. Cl.
  *B64D 27/24* (2006.01)
  *B64D 27/10* (2006.01)
  *F02C 3/04* (2006.01)
  *F02K 3/06* (2006.01)
  *B64D 27/02* (2006.01)

(56) References Cited

U.S. PATENT DOCUMENTS

| | | | |
|---|---|---|---|
| 6,810,946 B2 | 11/2004 | Hoang | |
| 7,213,391 B2 | 5/2007 | Jones | |
| 8,424,285 B2 | 4/2013 | Veilleux, Jr. | |
| 8,910,465 B2 | 12/2014 | Snyder | |
| 9,157,328 B2 | 10/2015 | Pope et al. | |
| 9,482,451 B2 | 11/2016 | Vaisman et al. | |
| 9,587,561 B2 | 3/2017 | Snyder et al. | |
| 9,889,807 B2 | 2/2018 | Siegel et al. | |
| 2004/0020213 A1* | 2/2004 | Jones | F28D 15/02 60/772 |
| 2005/0092469 A1* | 5/2005 | Huang | F21V 29/004 165/126 |
| 2007/0187072 A1* | 8/2007 | Chin | F28D 15/043 165/104.26 |
| 2007/0284090 A1 | 12/2007 | Wu et al. | |
| 2008/0164010 A1* | 7/2008 | Kang | F28D 15/0266 165/104.26 |
| 2008/0283223 A1* | 11/2008 | Chang | F28D 15/043 165/104.26 |
| 2010/0149755 A1 | 6/2010 | Tomioka et al. | |
| 2010/0300656 A1* | 12/2010 | Lu | F28D 15/0266 165/104.26 |
| 2011/0268562 A1* | 11/2011 | Knight | F01D 5/18 415/179 |
| 2013/0160974 A1* | 6/2013 | Uchida | F25D 15/0266 165/104.21 |
| 2014/0165570 A1 | 6/2014 | Herring | |
| 2014/0246170 A1 | 9/2014 | Snyder et al. | |
| 2014/0260340 A1 | 9/2014 | Vaisman et al. | |
| 2015/0047315 A1 | 2/2015 | Snyder | |
| 2015/0305199 A1* | 10/2015 | Yu | H01L 23/427 362/611 |
| 2016/0215696 A1 | 7/2016 | Snyder | |
| 2016/0305279 A1* | 10/2016 | Gerstler | F01D 9/041 |
| 2018/0023416 A1* | 1/2018 | Riaz | F01D 17/145 415/1 |
| 2018/0050810 A1* | 2/2018 | Niergarth | B64C 21/06 |

OTHER PUBLICATIONS http://norenproducts.com/products/heat-pipes/; printed Jul. 11, 2017 (2 pages).
http://www.sjsu.edu/people/nicole.okamoto/courses/me_146/FundamentalsofileatPipesII.ppt; PowerPoint presentation "Fundamentals of Heat Pipes," SAIED, Widah, printed Jul. 11, 2017 (67 pages).
http://www.thermacore.com/products/loop-heat-pipes-and-loop-devices.aspx; printed Jul. 11, 2017 (1 page).
http://www.thermacore.com/applications/power-electronics-cooling.aspx; printed Jul. 11, 2017 (1 page).
http://www.1-act.com/loop-heat-pipe-design-manufacturing-and-testing-an-industrial-perspective/; Anderson, W.G. et al., printed Jul. 11, 2017 (11 pages).
http://webcache.googleusercontent.com/search?q=cache:http://file.scirp.org/Html/1-1520058_55065.htm&num=1&strip=1&vwsrc=0. Shukla, K.N. (2015) Heat Pipe for Aerospace Applications—An Overview. *Journal of Electronics Cooling and Thermal Control*, 5, 1-14. http://dx.doi.org/10.4236/jectc.2015.51001; printed Jul. 12, 2017 (14 pages).
Maydanik, Yu. F., "Loop heat pipes", Applied Thermal Engineering 25 (2005) 635-657, *Institute of Thermal Physics,* Ekaterinburg, Russia, printed Jul. 14, 2017 (1 page).
https://www.1-act.com/resources/heat-pipe-fundamentals/different-types-of-heat-pipes/thermosyphons/lo . . . printed Jul. 19, 2017 (3 pages).
https://www.1-act.com/products/high-performance-power-electronics-coolers/ printed Jul. 19, 2017 (3 pages).
https://www.1-act.com/resources/heat-pipe-fundamentals/different-types-of-heat-pipes/ printed Jul. 19, 2017 (2 pages).
https://en.wikipedia.org/wiki/Heat_pipe#Diode_heat_pipes printed Jul. 20, 2017 (10 pages).
https://www.electronics-cooling.com/2003/05/an-introduction-to-pulsating-heat-pipes/ printed Jul. 19, 2017 (6 pages).
Singh, Miniature Loop Heat Pipe with Flat Evaporator for Cooling Computer CPU, IEEE Transactions on Components and Packaging Technologies, vol. 30, No. 1, Mar. 2007 (8 pages).

* cited by examiner

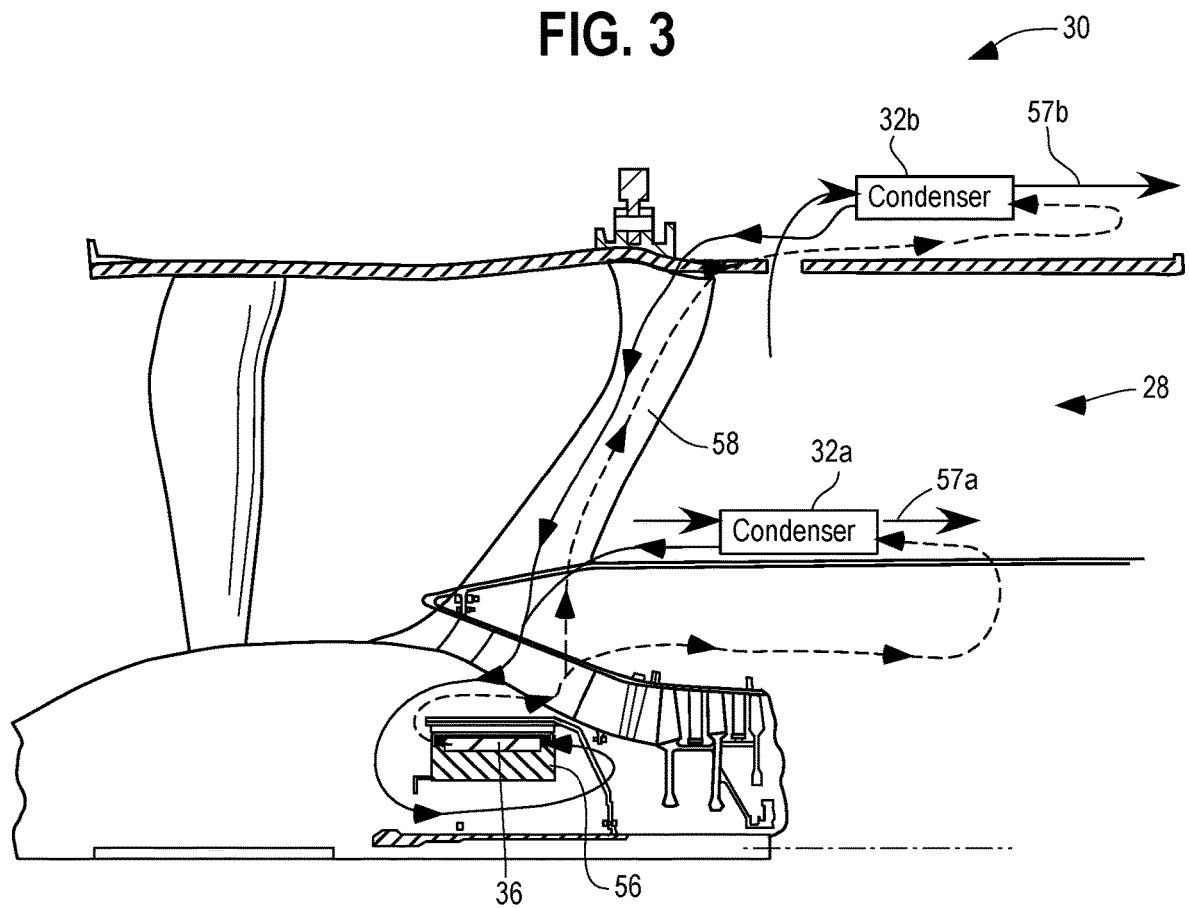

COOLING SYSTEM IN HYBRID ELECTRIC PROPULSION GAS TURBINE ENGINE

CROSS REFERENCE TO RELATED APPLICATIONS

Not applicable

REFERENCE REGARDING FEDERALLY SPONSORED RESEARCH OR DEVELOPMENT

Not applicable

SEQUENTIAL LISTING

Not applicable

FIELD OF DISCLOSURE

The present subject matter relates to gas turbine engines, and more particularly, to cooling systems in hybrid electric propulsion gas turbine engines.

BACKGROUND

In a hybrid electric propulsion gas turbine engine one or more electric machine(s) are used to provide power to an aircraft power generation component to assist in propulsion. The electric machine includes an engine/motor and a generator, which in combination are generally referred to as a Genset. Additionally, power electronics are utilized to transform and condition electric power for electric machines. In the aircraft manufacturing industry there is a need to reduce the total weight of the aircraft and the hybrid electric propulsion gas turbine engine to achieve better fuel efficiencies. In this quest, the size and the weight of electrical components that include the electric machines and any associated electronics are continually reduced while the power requirements of the electrical components are increased. A combination of smaller size/packaging and higher power/performance requirements result in electrical components that generate larger amounts of heat in smaller volumes. Higher heat fluxes in such smaller electrical components must be managed properly to reduce a risk of failure of the electrical components and the aircraft. Thus, there is a need to provide a cooling system to transfer heat away from the high power electrical components in a hybrid electric propulsion gas turbine engine.

SUMMARY

According to one aspect, a cooling system is provided in a hybrid electric propulsion gas turbine engine for cooling electrical components therein. The cooling system comprises an electrical component disposed in proximity to an aircraft power generation component in the hybrid electric propulsion gas turbine engine such that the electrical component is thermally heated by the aircraft power generation component. A loop heat pipe structure is in thermal communication with the electrical component to transfer heat away from the electrical component, wherein the loop heat pipe comprises an evaporator portion, a condenser portion, a first pipe to supply a biphasic working fluid in a liquid state to the evaporator portion, and a second pipe to return the biphasic working fluid in a gaseous state to the condenser portion.

According to another aspect, a hybrid electric propulsion gas turbine engine comprises an electrical component disposed in proximity to an aircraft power generation component in the hybrid electric propulsion gas turbine engine such that the electrical component is thermally heated by the aircraft power generation component. A loop heat pipe structure is in thermal communication with the electrical component to transfer heat away from the electrical component, wherein the loop heat pipe comprises an evaporator portion, a condenser portion, a first pipe to supply a biphasic working fluid in a liquid state to the evaporator portion, a second pipe to return the biphasic working fluid in a gaseous state to the condenser portion. A heat sink section is disposed in proximity to the condenser portion to cool the working fluid to the liquid state.

According to another aspect, a method of cooling electrical components in a hybrid electric propulsion gas turbine engine is provided. The method of cooling comprises disposing an electrical component in proximity to an aircraft power generation component in the hybrid electric propulsion gas turbine engine such that the electrical component is thermally heated by the aircraft power generation component, transferring heat away from the electrical component via a loop heat pipe structure in thermal communication with the electrical component, wherein the loop heat pipe comprises an evaporator portion, a condenser portion, a first pipe to supply a biphasic working fluid in a liquid state to the evaporator portion, a second pipe to return the biphasic working fluid in a gaseous state to the condenser portion. The method further comprises disposing the condenser portion in proximity to a heat sink.

BRIEF DESCRIPTION OF THE DRAWINGS

FIG. 3 is a fragmentary, schematic illustration of an example embodiment of a cooling system in the hybrid electric propulsion gas turbine engine;

DETAILED DESCRIPTION

Figure 1:
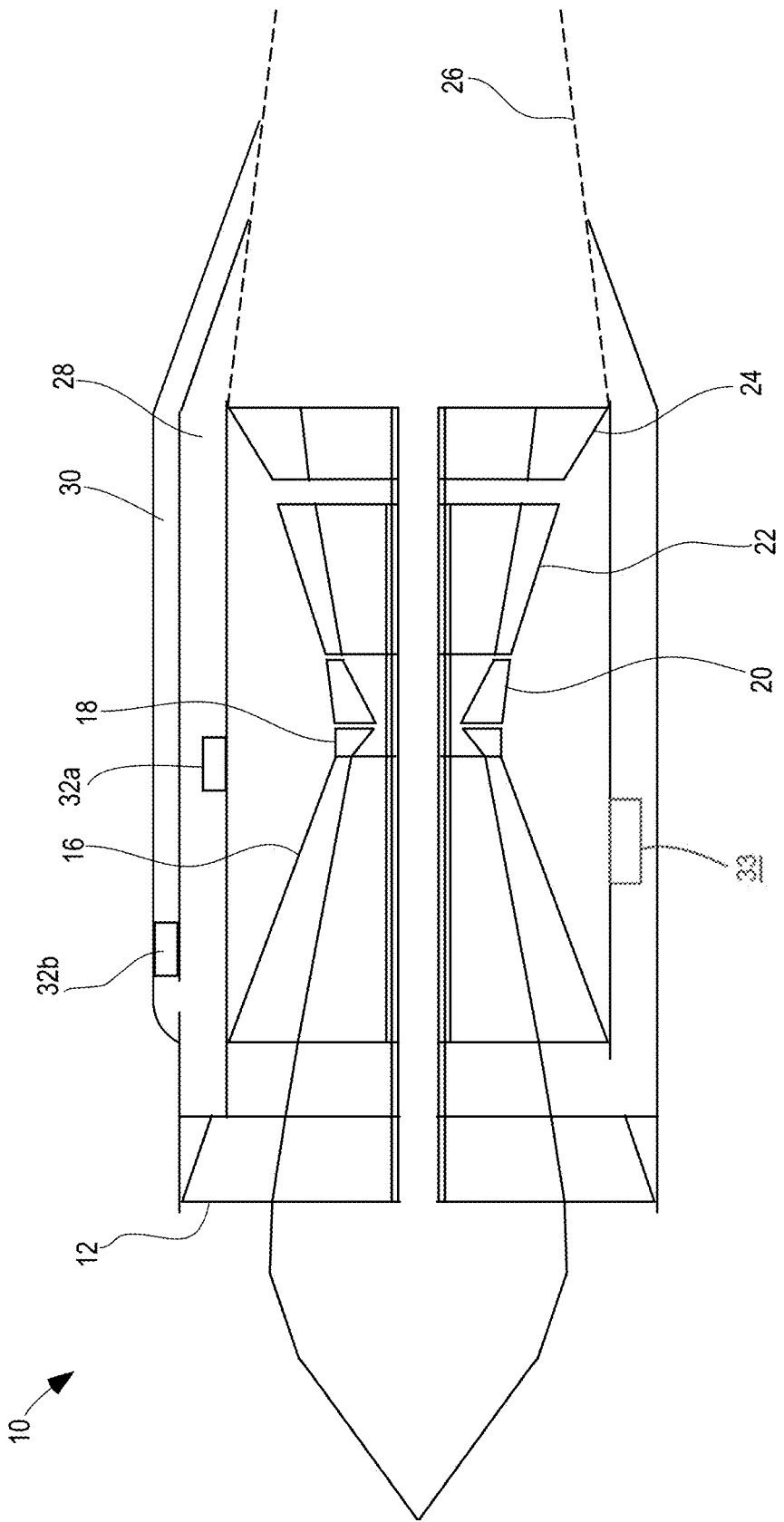
FIG. 1 schematically illustrates an embodiment of a hybrid electric propulsion gas turbine engine.

In the embodiments disclosed herein, specifically loop heat pipes (LHP) are used in a hybrid electric propulsion gas turbine engine of an aircraft to transfer heat away from electrical components disposed therein. The loop heat pipe incorporates special properties of capillary tube fluid transfer to move a working fluid through relatively long distances despite various orientations of the capillary tube and the effects of gravity. Referring to the drawings, and more specifically to FIG. 1, an example of a hybrid electric propulsion gas turbine engine is schematically illustrated. The hybrid electric gas turbine engine 10 is an aircraft propulsion power plant in a form of a turbofan engine. The hybrid electric gas turbine engine 10 includes a fan 12, a compressor 16, a diffuser 18, a combustor 20, a high pressure turbine 22, a low pressure turbine 24, an exhaust nozzle 26, a bypass duct 28, a bleed bypass duct 30, condensers 32a and 32b of an LHP (described below) that may be disposed in alternative locations, and an electrical machine or component 33 that can provide power to the aircraft power generation components to assist in propulsion.

Figure 2:
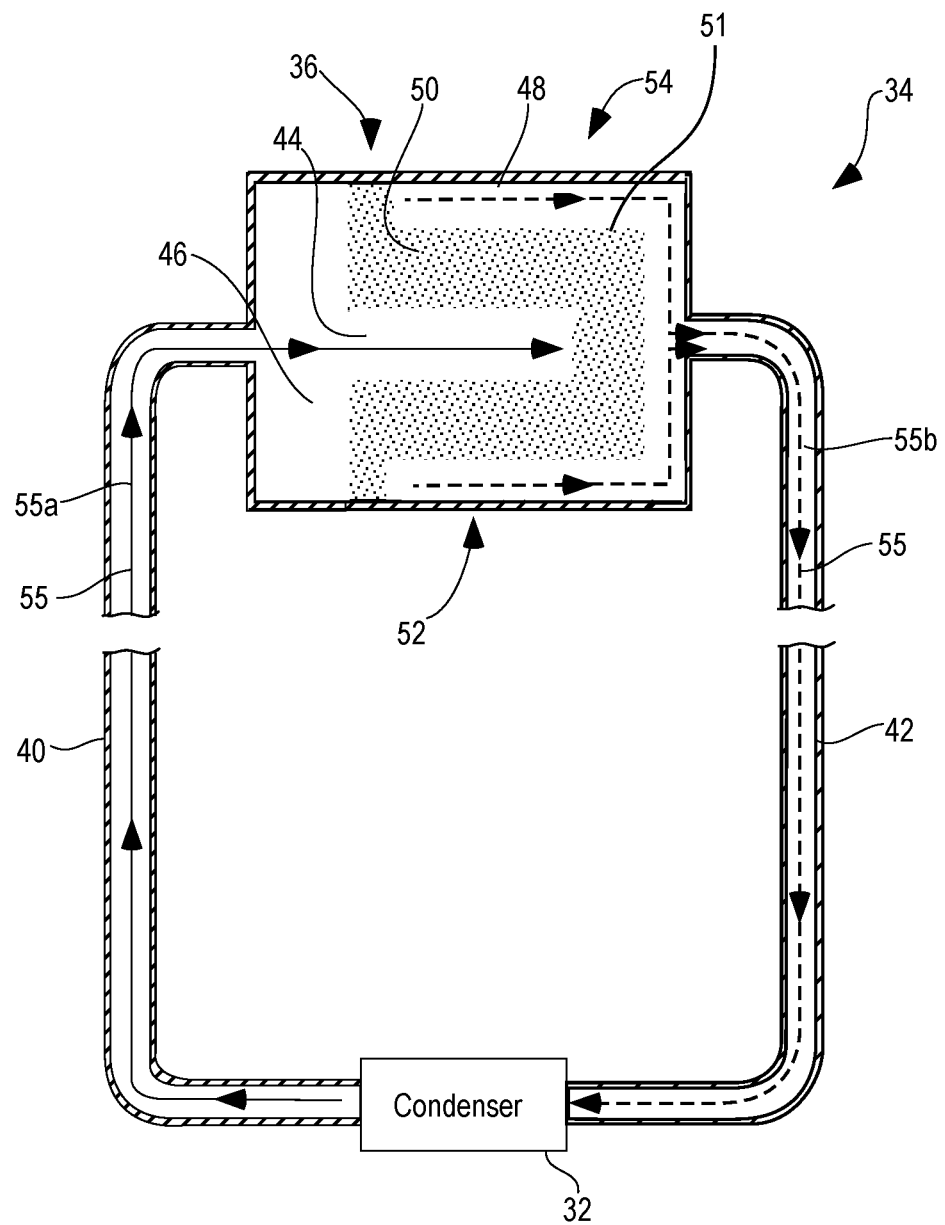
FIG. 2 schematically illustrates an embodiment of a loop heat pipe.
Figure 2A:
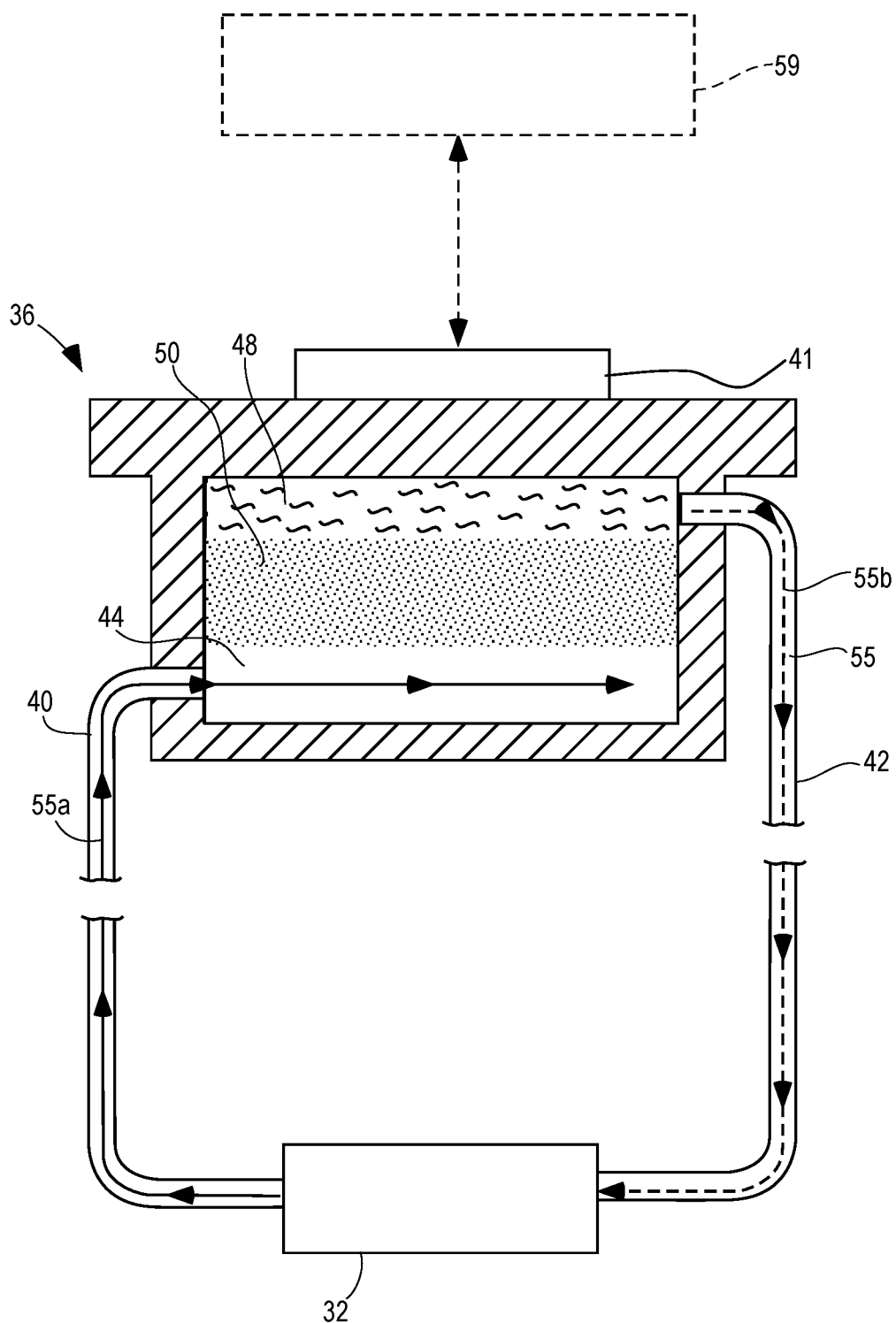
FIG. 2A schematically illustrates another embodiment of the loop heat pipe including a flat-shaped evaporator portion in thermal contact with associated flat-shaped electronics.

An example embodiment of an LHP is shown schematically in FIG. 2. The LHP structure 34 in this example comprises an evaporator portion 36, a condenser portion 32, a first pipe 40, and a second pipe 42. The evaporator portion 36 includes a liquid supply channel 44, a liquid compensation chamber 46, one or more vapor return channel(s) 48, and a wick structure 50. The supply channel 44 is centered at an inner portion of the evaporator portion 36, and the return channel 48 is disposed proximal to an outer portion of the evaporator portion 36. In operation, a biphasic working fluid 55 that is disposed within the LHP structure 34 is circulated between the condenser portion 32 and the evaporator portion 36. The working fluid 55 in the condenser portion 32 is cooled so that it condenses into a liquid state 55a and travels through the first pipe 40 to the supply channel 44 within the evaporator portion 36. The evaporator portion 36 is capable of being in thermal communication with a heat transfer object (described below). Heat is transferred from the outside of the evaporator 36 into the wick structure 50. The heat in the wick structure 50 causes the liquid in the wick structure 50 to evaporate from surface 51 into the vapor return channels 48. As the liquid in the wick structure 50 evaporates, additional working fluid from the liquid compensation chamber 46 and liquid supply channel 44 is wicked to surface 51 through capillary action. The working fluid in the liquid state 55a wetting the wick structure 50 prevents the vapor from passing into the wick structure 50 and therefore pressure increases in vapor return channel 48. This pressure rise forces the vapor to enter the second pipe 42 and flow to the condenser portion 32. When the working fluid in the gaseous state 55b enters the condenser portion 32, it condenses back to the liquid state 55a and, as such, one of the repeating cycles in the circulation is completed. The condensation of the working fluid 55 to the liquid state 55a is accomplished by a heat transfer effect from the condenser 32 to a heat sink. It should be noted that the liquid compensation chamber 46 provides a reservoir-like feature such that the working fluid in the liquid state 55a may accumulate therein. As the working fluid within the wick structure 50 is depleted due to evaporation at surface 51, the working fluid in the liquid state 55a traverses the wick structure 50 from the supply channel 44 to the surface 51. The evaporated vapor gas fills the return channels 48. The liquid working fluid 55a in the liquid compensation chamber 46, therefore, replenishes the liquid working fluid in the supply channel 44. The working fluid 55 that may be employed in the LHP 34 may be water, ammonia, propylene, refrigerants, or other fluids with the appropriate properties for two phase heat transfer. Referring to FIG. 2A, an enlarged, elevational view of an example embodiment of electronics 41 in contact with the LHP 34 and in proximity to an aircraft power generation component 59 is represented. As the electronics 41 are disposed in proximity to the aircraft power generation component 59, therefore, during operation of the hybrid electric propulsion gas turbine engine, the electronics 41 may be heated up. The evaporator portion 36 of the LHP 34 that is in thermal contact with the electronics 41 removes the heat load associated with the electronics 41 to maintain the temperature of the electronics 41 at an acceptable level close to the temperature of the evaporator portion 36 for proper operation. It should be noted that because the electronics 41 may have a flat or planar shape, the evaporator portion 36 also has a flat structure to conform to the flat shape of the electronics 41 and provide appropriate contact between surfaces of the evaporator portion 36 and the electronics 41 for a desirable heat transfer.

FIG. 3, is a fragmentary, schematic representation of an example embodiment of a cooling system in the hybrid electric propulsion gas turbine engine. As shown in FIG. 3, the evaporator portion 36 of the LHP 34 is disposed within and in contact with an element inside an electrical component 56. The electrical component 56 may be an electric machine such as a generator, an electric motor, or a combination Genset. In this circumstance, the electric machine would be an example of a heat transfer object. Alternatively, the heat transfer object may be in the form of electronics associated with and external to the electric machine. The electronics may be at least one of power electronics, control electronics, and sensor electronics. The electrical component 56 whether in the form of the electric machine or electronics is disposed in proximity to and communicates with an aircraft power generation component 59 (see FIG. 2A) in the hybrid electric propulsion gas turbine engine. The evaporator portion 36 is in thermal communication with the internal elements of the electrical component 56 such that heat is continuously transferred from the electrical component 56 to the evaporator portion 36. In this manner, internal temperature of the electrical component 56 is reduced to a desired level for proper operation of the same. As seen in FIG. 3, the condenser portion 32 of the LHP 34 may be disposed remotely from the evaporator portion 36 at a number of locations that are in proximity to a heat sink. For instance, a condenser portion 32a may be disposed in proximity to the heat sink that may be in a form of a fan stream air 57a. In this case, the condenser portion 32a is located within the fan stream. It may be a matrix heat exchanger (e.g. plate/fin or tube bank or other suitable condenser design). An alternative condenser portion 32b may be disposed inside the bleed bypass duct 30 (see FIG. 1) and in proximity to another heat sink that may be in a form of a fan stream bleed air 57b. This heat exchanger could also be of a plate/fin, tube bank, or other suitable matrix heat exchanger type design. In another circumstance, the condenser portion 32b may be disposed in another bleed duct (not shown) that is located adjacent and inboard relative to the bypass duct 28. In the alternative example embodiments, the condenser portion 32a may be a surface cooler type with fins (not shown) protruding into the fan stream air 57a. Furthermore, although not shown, a condenser portion 32 may be placed near or integrated with a fan outlet guide vane (OGV) 58. Also, the condenser portion 32 may be disposed in proximity to a heat sink section that may be at least one of engine oil, engine fuel, fan stream air, ram stream air, an engine nacelle and an aircraft skin. The condenser portion 32 may also be integrated or disposed in proximity to a fuel system (not shown) of the hybrid electric propulsion gas turbine engine.

Figure 4:
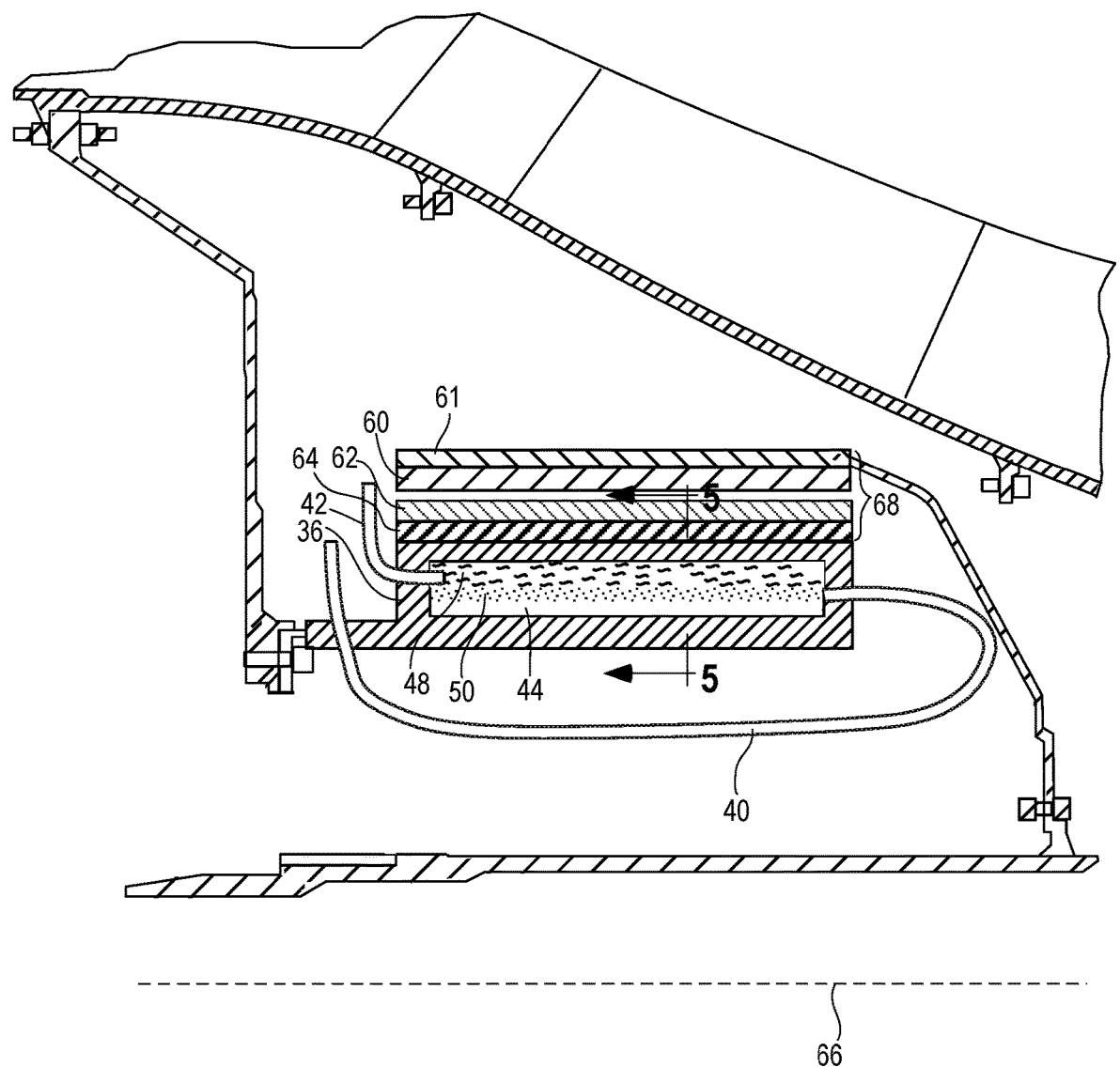
FIG. 4 is an enlarged, fragmentary, schematic illustration of the embodiment of the cooling system in the hybrid electric propulsion gas turbine engine of FIG. 3.

Referring to FIG. 4, an enlarged, fragmentary view of FIG. 3 is shown where the evaporator portion 36 is in contact and in thermal communication with internal elements of the electrical component, which in this example is an electric motor 68. The electric motor 68 comprises elements such as rotating magnets 60, retaining ring 61, copper windings 62, and an iron yoke 64. In this example, the rotating magnets 60 rotate around the stationary copper windings 62, iron yoke 64, and the evaporator portion 36 in a circular fashion with respect to the center line 66. The evaporator portion 36 removes heat from the internal elements of the electric motor 68 via the second pipe 42 and the first pipe 40 (return liquid working fluid) that are in thermal communication with any one of the condensers 32a and 32b. As described above, the condensers 32a and 32b are disposed in proximity to a variety of heat sinks that provide the desired cooling effect and heat transfer function to the example embodiment of electrical components such as electric motors, generators, and electronics of the hybrid electric propulsion gas turbine engine.

Figure 5:
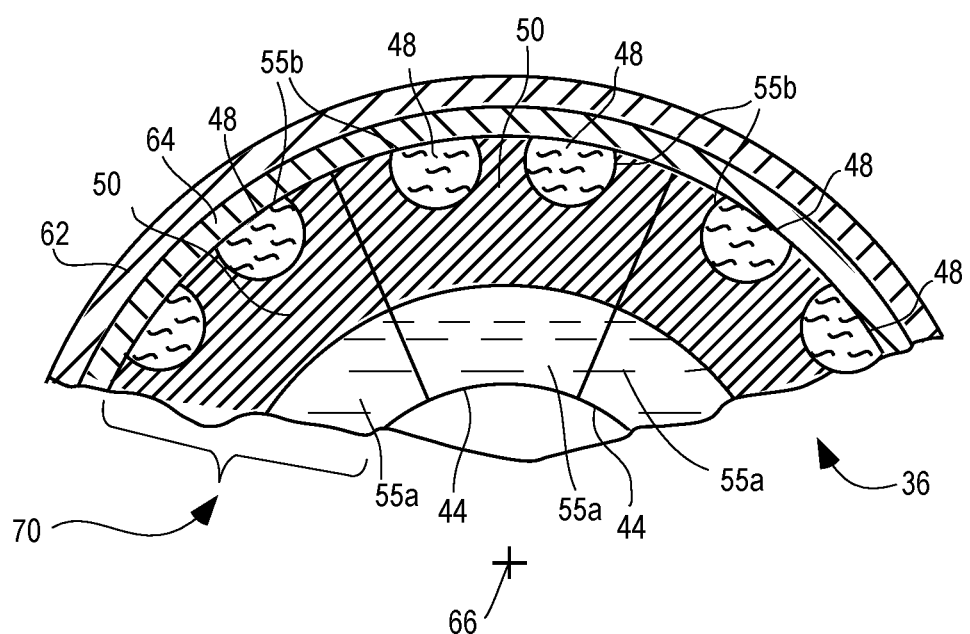
FIG. 5 is an enlarged, fragmentary, cross-sectional, front view along line 5-5 of the evaporator portion of the cooling system in contact with inside layers of a motor in the hybrid electric propulsion gas turbine engine.

Referring to FIG. 5, an enlarged, fragmentary, front, cross-sectional view along line 5-5 of a collection of evaporator portions 70 in contact with the iron yoke 64 of the electric motor 68 is illustrated. As seen, the collection of evaporator portions 70 includes individual evaporator portions 36 wherein each evaporator portion 36 includes a pair of vapor return channels 48 grouped together. Each evaporator portion does not have fluid communication through the wick structure with adjacent evaporator portions due to a barrier (e.g. the radial line). It should be noted that the each evaporator portion 36 may have a single vapor return channel 48 or a plurality of vapor return channels 48 depending on the cooling requirements of the heat transfer object that is to be cooled. In the example embodiment shown in FIG. 5, the evaporator portions 36 are disposed adjacent and contiguous with each other. In other embodiments (not shown), the evaporator portions may be disposed proximal but separated from each other. The working fluid in the liquid state 55a flowing through the liquid supply channel 44 is subjected to a heated environment and the heat from the copper windings 62 and iron yoke 64 of the motor 68. The liquid working fluid 55a is transported through the wick structure 50 and traverses the wick structure 50 until it is transformed to a vapor state. The gaseous working fluid 55b is collected in the vapor return channels 48 and passed to second pipe 42. A pressure difference is generated across the wick structure 50 that moves the working fluid 55 through the first pipe 40 and the second pipe 42 of the LHP 34 as described above. The return channels 48 feed into the second pipe 42 to provide the gaseous working fluid 55b to the condenser portion 32 as shown in FIG. 2. The segmentation of the evaporator minimizes the total liquid column height across the evaporator. In a large diameter motor, without the evaporator being segmented, the hydrostatic pressure due to the height of the liquid column could become excessively large. Assuming that gravity is acting downward in FIG. 5, this large hydrostatic pressure could overcome the maximum capillary pressure that can be sustained across the wick structure. This excessive hydrostatic pressure would lead to the liquid 55a passing through the wick structure 50 and flooding the vapor return channels 48 at the bottom of evaporator. This would result in degraded thermal performance of the loop heat pipe. In smaller diameter motors/evaporators, the hydrostatic pressure will be sufficiently small such that the evaporator does not need to be segmented.

It should be noted that in other example embodiments, the collection of evaporator portions 70 may be disposed adjacent to the electronics associated with the electric motor(s) 68 in the hybrid electric propulsion gas turbine engine.

Other embodiments of cooling systems in hybrid electrical propulsion gas turbine engines are disclosed in a co-pending U.S. application Ser. No. 15/645,346, entitled: "Cooling System in a Hybrid Electric Propulsion Gas Turbine Engine For Cooling Electrical Components Therein", filed on Jul. 10, 2017, owned by the assignee of the present application, the content of which is incorporated by reference in its entirety in the present application.

INDUSTRIAL APPLICABILITY

As provided herein, the cooling system may be employed in connection with electrical components, and more specifically electrical components intended to be used in a hybrid electric propulsion gas turbine engine. The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

I claim:

1. A cooling system in a hybrid electric propulsion gas turbine engine for cooling electrical components therein, the cooling system comprising:
    an electric machine disposed in proximity to an aircraft power generation component in the hybrid electric propulsion gas turbine engine such that the electric machine is thermally heated by the aircraft power generation component;
    a loop heat pipe structure in thermal communication with the electric machine to transfer heat away from the electric machine, wherein the loop heat pipe comprises:
        a first evaporator portion disposed in contact with the electrical machine and having a first wick structure and a first vapor return channel;
        a second evaporator portion disposed in contact with the electrical machine and having a second wick structure and a second vapor return channel;
        a barrier disposed between the first and second wick structures;
        a condenser portion disposed remotely from the electrical machine;
        a first pipe to supply a biphasic working fluid in a liquid state to the first and second evaporator portions; and
        a second pipe to return the biphasic working fluid in a gaseous state from the first and second vapor return channels to the condenser portion;
    wherein the first evaporator portion, the barrier, and the second evaporator portion are disposed adjacent to and contiguous with each other and the barrier prevents fluid communications between the first and second wick structures.

2. The cooling system of claim 1, wherein the condenser portion is disposed in proximity to a heat sink section to cool the working fluid from the gaseous state to the liquid state.

3. The cooling system of claim 2, wherein the heat sink section comprises at least one of engine oil, engine fuel, fan stream air, ram stream air, an engine nacelle, and an aircraft skin.

4. The cooling system of claim 1, wherein the electric machine is one of a generator, an electric motor, or a combination genset.

5. The cooling system of claim 1, wherein the first and second evaporator portions comprise first and second supply channels, respectively, disposed distal from the heated electric machine to provide the working fluid in the liquid state and the first and second return channels are disposed proximal to the heated electric machine to return the working fluid in the gaseous state.

6. The cooling system of claim 5, wherein the first wick structure is disposed between the first supply channel and the first vapor return channel, the second wick structure is disposed between the second supply channel and the second vapor return channel, the working fluid in the first and second supply channels traverses the first and second wick structures, respectively, such that heat from the electric machine transforms the working fluid from the liquid state to the gaseous state through the first and second wick structures.

7. The cooling system of claim 3, wherein the heat sink section comprises the fan stream air, and wherein the condenser portion disposed in proximity to the fan stream air is a surface cooler.

8. The cooling system of claim 3, wherein the condenser portion is a matrix heat exchanger disposed in a path of the fan stream air.

9. The cooling system of claim 3, wherein the condenser portion is a matrix heat exchanger disposed in a path of a bleed stream air emanating from the fan stream air.

10. The cooling system of claim 3, wherein the condenser portion is a condenser integrated into a fan outlet guide vane (OGV) in a path of the fan stream air.

11. A hybrid electric propulsion gas turbine engine, comprising:
   an electrical machine disposed in proximity to an aircraft power generation component in the hybrid electric propulsion gas turbine engine such that the electrical machine is thermally heated by the aircraft power generation component;
   a loop heat pipe structure in thermal communication with the electrical machine to transfer heat away from the electrical machine, wherein the loop heat pipe comprises:
      an evaporator portion in contact with the electrical machine and having a first wall, a second wall, a wick structure, wherein the wick structure is in contact with and extends between the first and second walls, and barriers disposed in the evaporator portion to form a collection of evaporator subportions, wherein each barrier of the fluid communication through the wick structure between respective adjacent evaporator subportions;
      a condenser portion disposed remotely from the evaporator portion;
      a first pipe to supply a biphasic working fluid in a liquid state to the evaporator portion via an inlet in the first wall;
      a second pipe to return via an outlet in the second wall the biphasic working fluid in a gaseous state from the evaporator portion to the condenser portion; and
      a heat sink section disposed in proximity to the condenser portion to cool the working fluid to the liquid state.

12. A hybrid electric propulsion gas turbine engine of claim 11, wherein the heat sink section comprises at least one of engine oil, fan stream air, ram stream air, an engine nacelle, and an aircraft skin.

13. The hybrid electric propulsion gas turbine engine of claim 12, wherein the evaporator portion comprises:
   a supply channel disposed distal from the heated electrical machine to provide the working fluid in the liquid state; and
   a return channel disposed proximal to the heated electrical machine to return the working fluid in the gaseous state.

14. The hybrid electric propulsion gas turbine engine of claim 13, wherein the working fluid in the supply channel traverses the wick structure disposed between the supply channel and the return channel such that heat from the electrical machine transforms the working fluid from the liquid state to the gaseous state through the wick structure.

15. The hybrid electric propulsion gas turbine engine of claim 14, wherein a pressure difference is generated across the wick structure that moves the working fluid through the first pipe and the second pipe.

16. The hybrid electric propulsion gas turbine engine of claim 15, wherein the return channel feeds into the second pipe to provide the gaseous working fluid to the condenser portion, and wherein the liquid working fluid is supplied through the first pipe from the condenser portion to the supply channel of the evaporator portion.

17. The hybrid electric propulsion gas turbine engine of claim 12, wherein the condenser portion is a matrix heat exchanger disposed in a path of a bleed stream air emanating from the fan stream air.

* * * * *

UNITED STATES PATENT AND TRADEMARK OFFICE
CERTIFICATE OF CORRECTION

PATENT NO. : 10,842,044 B2  
APPLICATION NO. : 15/645490  
DATED : November 17, 2020  
INVENTOR(S) : Douglas J. Snyder Page 1 of 1

It is certified that error appears in the above-identified patent and that said Letters Patent is hereby corrected as shown below:

In the Claims

Column 8, Line 6 (Claim 11): Replace "wherein each barrier of the fluid communication" with -- "wherein each barrier of the barriers prevents fluid communication"

Signed and Sealed this
Twenty-sixth Day of September, 2023

Katherine Kelly Vidal
*Director of the United States Patent and Trademark Office*